(12) United States Patent  
Ferris

(10) Patent No.: US 7,019,562 B1
(45) Date of Patent: Mar. 28, 2006

(54) METHOD AND APPARATUS FOR LOCALLY REGULATED CIRCUIT

(75) Inventor: Daniel J. Ferris, Lakeville, MN (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 10/737,284

(22) Filed: Dec. 16, 2003

(51) Int. Cl.
*H03K 5/22* (2006.01)

(52) U.S. Cl. .................... 327/65; 327/436; 327/543

(58) Field of Classification Search ............ 327/65, 327/437, 540, 541, 543; 323/315, 316
See application file for complete search history.

(56) References Cited

U.S. PATENT DOCUMENTS

| | | | |
|---|---|---|---|
| 6,191,994 B1* | 2/2001 | Ooishi | 365/226 |
| 6,292,031 B1* | 9/2001 | Thompson et al. | 327/66 |
| 6,774,722 B1* | 8/2004 | Hogervorst | 330/258 |
| 6,819,165 B1* | 11/2004 | Ho et al. | 327/541 |

* cited by examiner

*Primary Examiner*—Terry D. Cunningham
(74) *Attorney, Agent, or Firm*—LeRoy D. Maunu; Michael T. Wallace

(57) ABSTRACT

According to one embodiment, a locally regulated circuit regulates current flows ($I_{REG}$ and $I_{RG}$) through the operation of a current mirror (334, 332, 326). The regulated current flows are used to self-generate a common mode voltage ($V_{422}$) at node (322) and to produce the required bias signals through input stage (302 and 308) and output stage (314 and 316) in response to data input signals (D and D-complement). Cancellation of common mode voltage variation is further enhanced by generating a supplemental current in response to an error signal generated by comparing a desired common mode voltage ($V_{CM}$) to the actual common mode voltage at node (322). The supplemental current conducted by either of loads (310 and 312) serves to regulate the common mode voltage at node (322).

17 Claims, 3 Drawing Sheets

METHOD AND APPARATUS FOR LOCALLY REGULATED CIRCUIT

FIELD OF THE INVENTION

The present invention generally relates to current mode logic (CML) circuits, and more particularly to locally regulated CML circuits.

BACKGROUND

Circuit designers are often required to deal with design constraints such as: speed, power, cost, and size. Generally speaking, optimizing one design parameter often requires a sacrifice in performance of one or more of the other design parameters. Where the shortest switching time is desired, for example, a higher quiescent power requirement may be necessitated. Alternately, a higher density of gates per square inch of die may increase die area usage efficiency, but may also reduce gate geometries, thus limiting current conduction capability. Other design considerations, such as cost effectiveness, are also high on the priority list for circuit designers.

The technology used to fabricate integrated circuits can present a unique set of cost constraints to the circuit designer as compared to a discrete realization of the same circuit. For example, one cost determining factor with integrated circuits is the number of Input/Output (I/O) pins that may be required. Some integrated circuit designs, for example, require capacitive loading to create a power supply bypass for increased noise immunity. Bypass capacitors used in some discrete circuit designs, however, are prohibitive in an integrated circuit implementation due to the feasibility of construction of the larger-sized capacitors on the die. If capacitors are required, therefore, they must be external to the integrated circuit which adds pin count and drives the cost of the integrated circuit design upward. Capacitor-free integrated circuit designs, therefore, are generally highly desirable.

Another design constraint for integrated circuit design is die area. Generally speaking, the least-expensive component that can be fabricated on the integrated circuit is the component that requires the least amount of die area, usually a transistor. Thus, a circuit realization that contains a minimum total number of passive components, while using a greater number of active components may be optimum.

One area of integrated circuit design that has been under considerable design scrutiny is the emitter-coupled, or alternatively, the source-coupled pair configuration of the differential amplifier. One example of the usefulness of this circuit stems from the fact that cascades of the emitter-coupled, or source-coupled, pairs may be implemented without the need for capacitive coupling. Also, the differential characteristics of this circuit type, e.g., common mode rejection, is also a highly desirable characteristic.

In some conventional differential amplifier designs, active components may be used as the load elements to increase the gain of the devices. Active load elements, however, tend to add noise to the output, either in the form of shot noise, as is the case with bipolar designs, or in the form of thermal or flicker noise, as is the case with all active load designs.

In other differential amplifier designs, passive loading may be used to reduce output noise, but may suffer from power supply noise rejection. The resistive load, for example, is generally connected between the collector, or drain, of each transistor of the output stage differential pair and the top rail power supply. In such a configuration, any power supply noise or ripple is almost directly translated to the output via the resistive load. Such Amplitude Modulated (AM) noise translates to Phase Modulated (PM) noise and produces phase jitter.

As technology associated with integrated circuit design progresses, alternate forms of loading and common mode voltage ripple cancellation are developed to reduce phase jitter associated with power supply noise. An apparatus and method that advances the art of canceling common mode voltage variation, and other related problems, continues to be desirable.

SUMMARY OF THE INVENTION

Various embodiments of the present invention that address the aforementioned issues and that are directed towards advancements in power supply ripple rejection and cancellation of common mode signal variation are provided.

According to one embodiment, a circuit comprising a power-regulating circuit is adapted to respond to a power supply voltage by providing an operating current and an operating voltage to a common node. The power-regulating circuit includes a current mirror that is adapted to provide the operating current to the common node. The circuit further comprises a stabilizer that is adapted to stabilize the operating voltage at the common node in response to differences between a first reference voltage and a feedback voltage indicative of variations at the common node.

According to another embodiment, a circuit is adapted to generate constant operational signals from a power supply voltage having a noise component. The circuit comprises a current mirror that is adapted to generate an operating current from the power supply voltage and is coupled to supply the operating current to a common node. The circuit further comprises a voltage regulator that is adapted to generate an operating voltage from a first portion of the operating current and is coupled to supply the operating voltage to the common node. The circuit further comprises an output stage that is adapted to conduct a second portion of the operating current to generate an output signal referenced to the operating voltage. The circuit further comprises a common mode stabilizer that is adapted to compare the operating voltage to a first reference voltage and is further adapted to compensate the operating current to cancel variations in the operating voltage at the common node.

According to another embodiment, a locally regulated circuit comprises means for generating a constant current signal from a power supply signal, a means for generating a voltage signal from a first portion of the constant current signal, a means for conducting a second portion of the constant current signal to generate an output signal referenced to the voltage signal, a means for comparing the voltage signal to a reference signal to generate an error signal, and a means for compensating the constant current signal in response to the error signal to regulate the voltage signal.

According to another embodiment, a method of operating a locally regulated circuit comprises generating a constant current signal from a power supply signal, generating a voltage signal from a first portion of the constant current signal, conducting a second portion of the constant current signal to generate an output signal referenced to the voltage signal, comparing the voltage signal to a reference signal to generate an error signal, and compensating the constant current signal in response to the error signal to regulate the voltage signal.

It will be appreciated that various other sample embodiments are set forth in the Detailed Description and claims which follow.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of CML circuit elements having enhanced Power Supply Rejection Ratio (PSRR), reduced output noise, and reduced common mode voltage variation. Embodiments of the CML circuit elements are illustrated as logic circuits, e.g., D-type latch circuits, and are implemented using complimentary P-type Field Effect Transistor (PFET) and N-type (NFET) topologies. Those embodiments may also be implemented in other circuit topologies such as bipolar or bipolar/Complimentary Metal Oxide (biCMOS) circuit topologies. Additionally, the differential amplifiers depicted herein have a vast number of applications in both analog and digital circuitry. Thus, the embodiments shown are not intended to be limiting, but rather are provided for illustrative purposes only.

In one exemplary embodiment of the present invention, a power-regulating circuit is integrated within a latch circuit design, whereby the power-regulating circuit generates an operating current and an operating voltage from a power supply and supplies the operating signals to a common node. The power-regulating circuit includes a current mirror that is adapted to provide the operating current to the common node. Additionally, a stabilizer is adapted to stabilize the operating voltage at the common node by detecting differences between a reference voltage and a feedback voltage that are indicative of variations at the common node.

Figure 1:
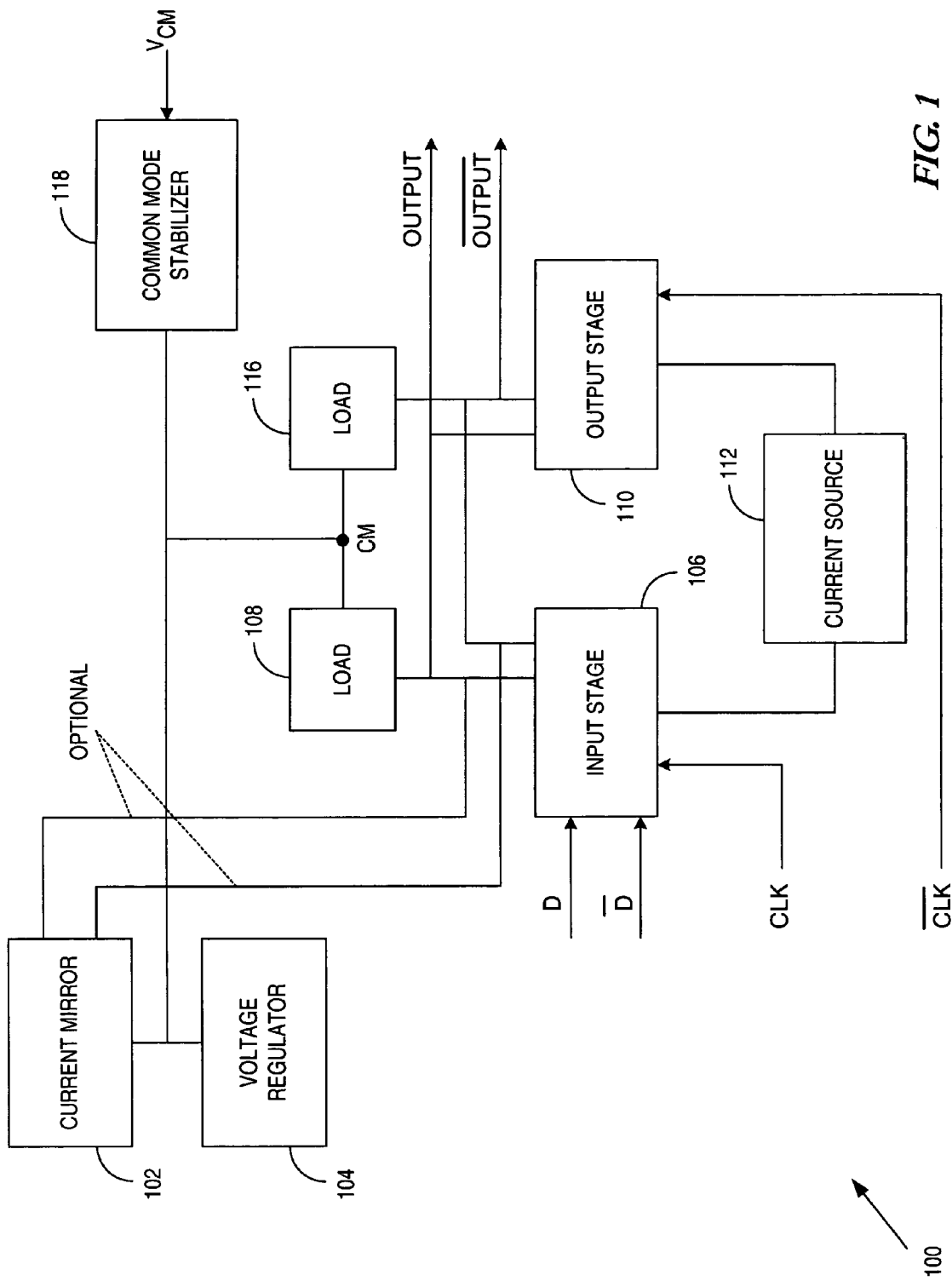
FIG. 1 illustrates a functional block diagram in accordance with the present invention.

Functional block diagram 100 of FIG. 1 illustrates an exemplary block diagram of various circuit functions that are in accordance with the present invention. Block diagram 100 illustrates a combination of voltage regulation and passive loading that is used to achieve improved power supply isolation as well as decreased load noise. Power supply rejection ability is enhanced through the use of voltage regulator 104, while the required current bias also enhances power supply rejection ability through the use of current mirror 102 and current source 112. In addition, common mode stabilizer 118 monitors the common mode voltage developed across passive loads 108 and 116 and either subtracts from, or adds to, the current provided by current mirror 102 to substantially cancel the common mode voltage variation at node CM.

Current mirror 102 and voltage regulator 104 combine to provide a stable voltage reference with which output signal levels may be derived. Additionally, current mirror 102 may feed bias signals for both input stage 106 and output stage 110 through passive loads 108 and 116. Alternately, current mirror 102 may also supplement current drive levels between loads 108/116 and input/output stages 106/110 as shown.

Input stage 106 is enabled to receive signals D and D complement, for example, by a logic high level of signal CLK. Once enabled, signal D and D complement are transferred to output stage 110. The current bias required to transfer the data signals from input stage 106 to output stage 110 is delivered by current mirror 102 through passive loads 108 and 116 to input stage 106 and terminated by current source 112.

Output stage 110 is enabled to receive the transferred data signals, for example, by a logic high level of signal CLK-complement. In order to latch the data signals into output stage 110, the required current bias is provided by current mirror 102 through passive loads 108 and 116 to output stage 110 and terminated by current source 112.

Common mode voltage variation at node CM is detected by common mode stabilizer 118 and subsequently compared to $V_{CM}$. The difference between the common mode voltage variation at node CM and $V_{CM}$ generates an error signal that is then translated to a current signal. The current signal either adds to, or subtracts from, the current being supplied by current mirror 102 to node CM, such that the common mode voltage variation developed across passive loads 108 and 116 is substantially cancelled by the voltage developed across passive loads 108 and 116 in response to the current translated error signal.

Figure 2:
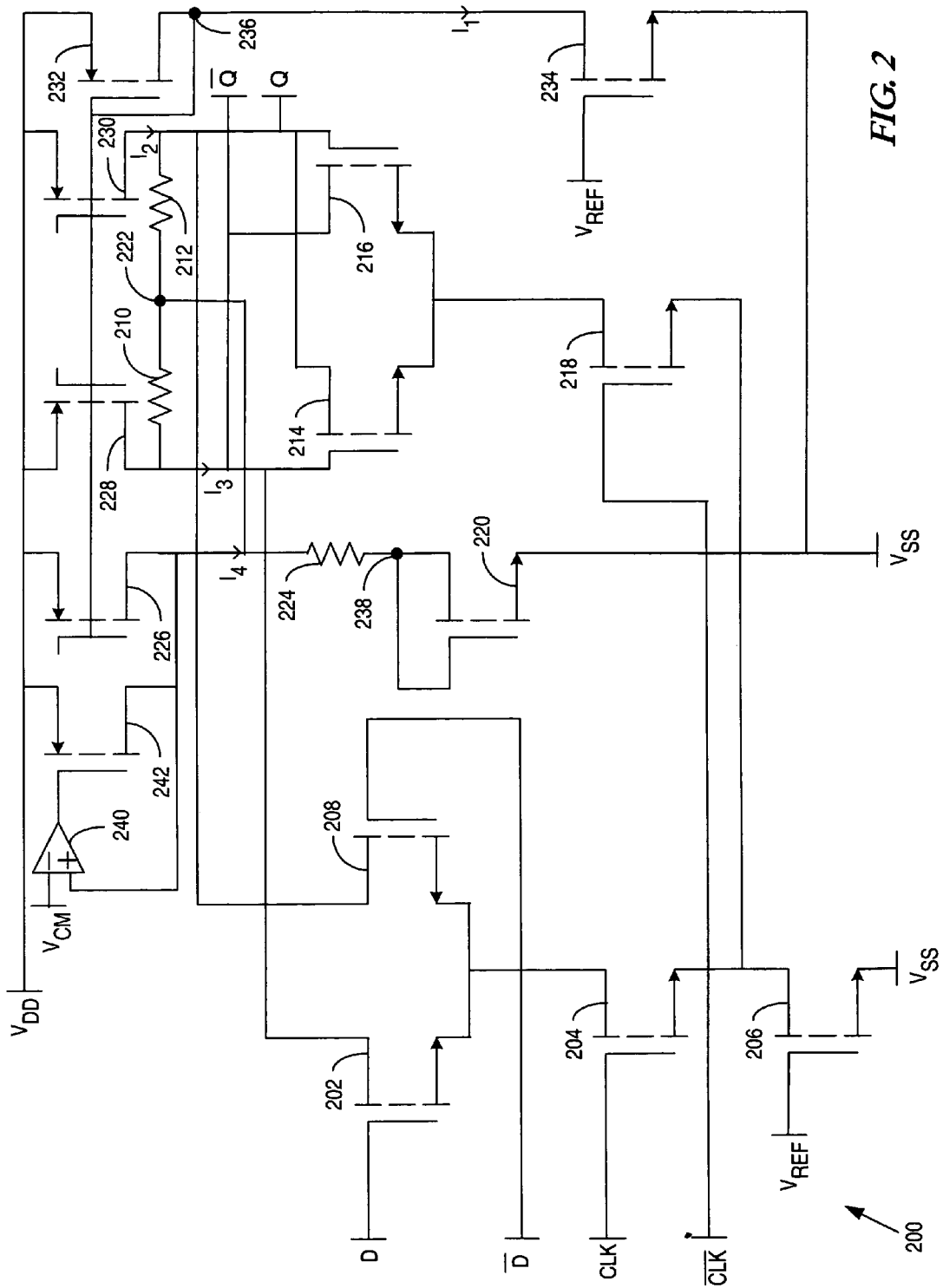
FIG. 2 illustrates an exemplary latch circuit according to the present invention.

A representative implementation of block diagram 100 is exemplified by latch circuit 200 of FIG. 2 in accordance with the present invention. Latch circuit 200 adds voltage regulation to reduce the translation of power supply ripple to outputs Q and Q-complement. In particular, current mirror 102 may be implemented, for example, through the use of transistors 226, 232 and 234 to set a bias voltage at node 222 through the use of voltage regulator 104, e.g., diode connected transistor 220 and resistor 224, that is substantially independent of power supply $V_{DD}$. In addition, active loads 228 and 230 are utilized to provide output current drive, e.g., OPTIONAL outputs from current mirror 102, that are also substantially independent of power supply $V_{DD}$. Additionally, common mode stabilizer circuit 118 utilizes, for example, current source 242 to provide additional current into node 222, as required by error generation circuit 240, to substantially eliminate common mode voltage variations at node 222.

The source terminals of transistors 226–232 are each coupled to power supply $V_{DD}$. The drain terminal of transistor 226 is coupled to a first conductor of resistor 224 and to first conductors of resistors 210 and 212 at node 222. The second conductor of resistor 224 is coupled to the drain and gate terminals of transistor 220. The source terminal of transistor 220 is coupled to power supply reference $V_{SS}$.

The source terminal of current source 234 is coupled to power supply reference $V_{SS}$ and its gate terminal is referenced to the same voltage reference, $V_{REF}$, as current source 206. The drain terminal of current source 234 is coupled to the drain and gate terminals of transistor 232. Transistor 232 is diode connected to provide a reference voltage for the gate terminals of transistors 226–230. The drain terminals of transistors 228 and 230 are coupled to second conductors of resistors 210 and 212.

Operational amplifier 240 receives common mode voltage, $V_{CM}$, at its inverting input. The non-inverting input is coupled to node 222 and the drain terminal of transistor 242. The output of operational amplifier 240 is coupled to the gate terminal of transistor 242. It should be noted that an operational transconductance amplifier (OTA) may be used in place of operational amplifier 240, since the low output impedance of operational amplifier 240 is not necessarily required. However, in the event that an OTA is used, its relatively high output impedance may be used in combination with the gate capacitance of transistor 242 to provide additional low pass filtering of power supply noise.

In operation, reference current $I_1$ produced by current source 234 is mirrored by currents $I_2$–$I_4$ in ratio proportion to the relative geometries of transistors 230, 228, and 226 to transistor 232. The current mirror effect is produced by a voltage reference, $V_{236}$, created at node 236 by the conduction of reference current $I_1$ through transistor 232. $V_{236}$ forces the gate to source voltage, $V_{GS}$, of transistors 226–232 to be equal to each other, since each of the gate terminals of transistors 226–232 are connected to node 236 and each of the source terminals of transistors 226–232 are connected to $V_{DD}$. Transistors 226–232 exhibit additional power supply noise rejection, since each are operated in their respective saturation regions. In saturation, any variation in $V_{DS}$ results in very little variation in $I_D$.

Since the $V_{GS}$ of transistors 226–232 are equal, their respective drain currents will be proportional to each other according to their respective geometries. For example, reference current $I_1$ may be set to 300 micro-amps (A) due to the conductivity state of transistor 234 set by $V_{REF}$. If transistor 230 is four times the size of transistor 232, for example, then current $I_2$ will be equal to 4 times the reference current $I_1$, or 1.2 milli-amps (mA). The same ratio relationship exists for current $I_3$ and $I_4$ to $I_1$ as well.

Reference voltage, $V_{238}$, is created at node 238 by the conduction of current $I_4$ through diode connected transistor 220. The reference voltage at node 222, $V_{222}$, is therefore equal to $V_{222}=V_{238}+I_4*R_{224}$, where $R_{224}$ is the resistance value of resistor 224. Since $I_4$ has a ratio relationship to current $I_1$, which is substantially independent of power supply $V_{DD}$, then $V_{222}$ is likewise substantially independent of power supply $V_{DD}$.

The relationship of output logic values at terminals Q and Q-complement to input data signals D and D-complement are consistent with differential amplifier logic. The actual voltage levels corresponding to $V_{OH}$ at terminals Q and Q-complement, however, correspond to a regulated voltage reference value in accordance with the present invention. In particular, $V_{OH}$ at either of terminals Q and Q-complement is substantially equal to $V_{222}$, the reference voltage established by mirror current $I_4$ in combination with transistor 220 and resistor 224.

Additionally, $V_{OL}$ is established through the conduction of active loads 228 and 230. For example, if terminal Q is at a logic low, then transistors 230, 214, 218, and 206 form the conduction path for current $I_2$. Consequently, $V_{OL}=V_{DD}-V_{DS230}$, where $V_{DS230}$ is the drain to source voltage of transistor 230.

Alternately, if terminal Q-complement is at a logic low, then transistors 228, 216, 218, and 206 form the conduction path for current $I_3$. Consequently, $V_{OL}=V_{DD}-V_{DS228}$, where $V_{DS228}$ is the drain to source voltage of transistor 228.

The common mode component of $V_{222}$, $V_{CM222}$, is monitored by operational amplifier 240 and compared with the voltage level of $V_{CM}$ to form an error signal at the gate of transistor 242. The error signal affects the conductivity of current source 242, such that any common mode voltage variation at node 222 is substantially cancelled by current output variation from current source 242.

For example, if $V_{CM222}$ drops, the decrease is detected by operational amplifier 240 and the difference between $V_{CM222}$ and $V_{CM}$, i.e., the error signal, is reflected at the gate terminal of transistor 242 as the amplified error signal. The amplified error signal causes a decrease in gate voltage at transistor 242, which causes transistor 242 to conduct more current. The additional current is additive to current $I_4$, which develops a voltage increase across resistor 210 or 212 to substantially cancel the common mode voltage decrease at node 222.

Conversely, if $V_{CM222}$ increases, the increase is detected by operational amplifier 240 and the difference between $V_{CM222}$ and $V_{CM}$, i.e., the error signal, is reflected at the gate terminal of transistor 242 as the amplified error signal. The amplified error signal causes an increase in gate voltage at transistor 242, which causes transistor 242 to conduct less current. The depleted current causes a voltage decrease to appear across resistor 210 or 212 to substantially cancel the common mode voltage increase at node 222.

It should be noted that although resistive elements 210 and 212 are illustrated as resistors, one of ordinary skill in the art recognizes that resistive elements may also be implemented with active components. For example, resistive elements 210 and 212 may be implemented with FET devices operating in their respective ohmic or triode region. In the ohmic or triode region, the FET device behaves as a voltage controlled resistive element, whereby the drain to source voltage increases with increasing drain current. As such, the appropriate V-I characteristic may be set by the FET's control voltage to implement the required resistance value.

One characteristic of latch circuit 200, however, is that flicker noise may be generated at terminals Q and Q-complement by the addition of active loads 228 and 230. The amount of flicker noise generated by active loads 228 and 230 is largely dependent upon device geometry and more particularly, to the active gate area of the transistor. The flicker noise is also proportional to the inverse of the gate-oxide capacitance per unit area of transistors 228 and 230.

Figure 3:
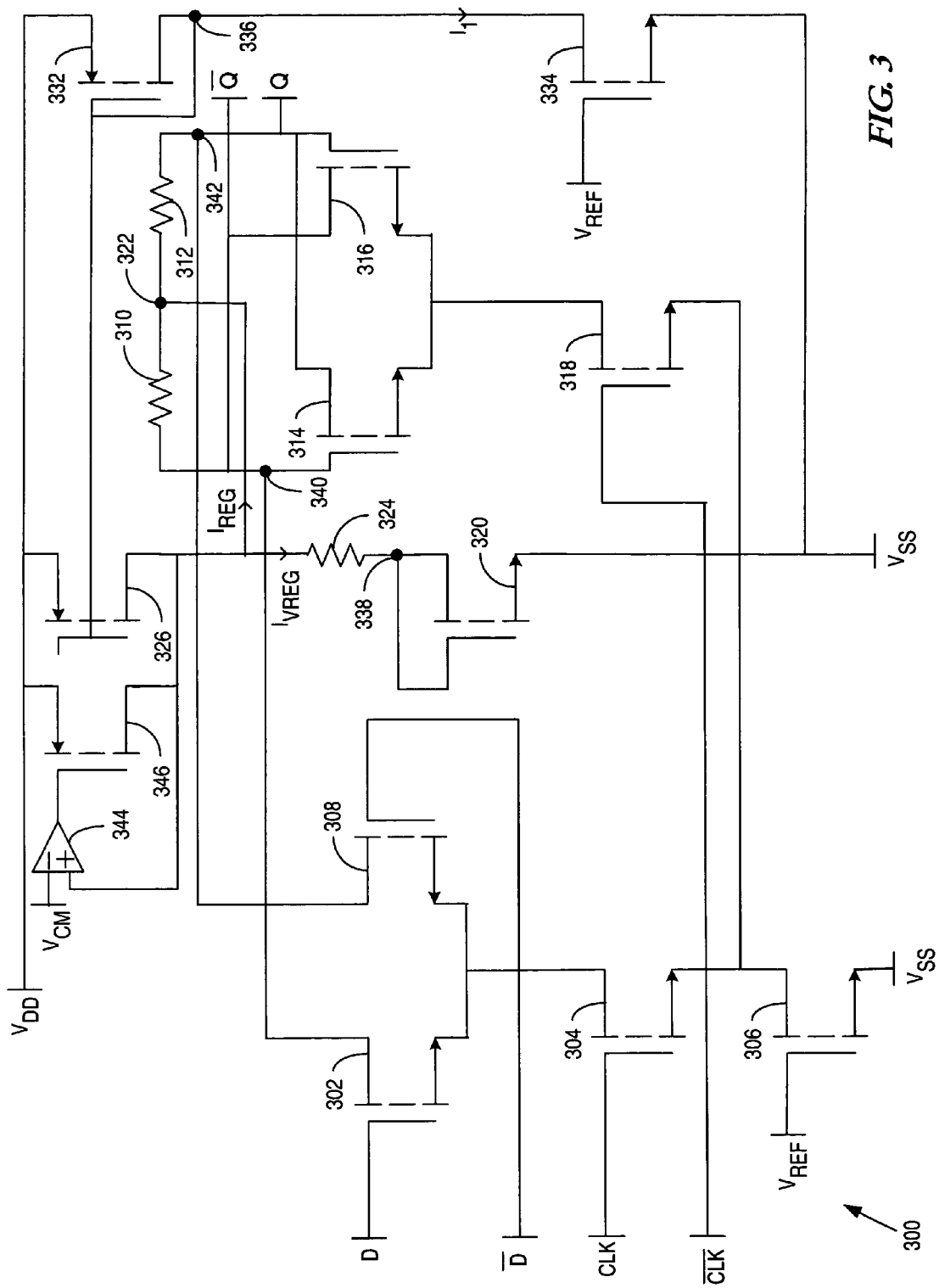
FIG. 3 illustrates an alternate embodiment of a latch circuit in accordance with the present invention.

An alternate embodiment of an exemplary implementation of functional block diagram 100 is illustrated by a schematic diagram of latch circuit 300 of FIG. 3 according to the present invention, whereby OPTIONAL current paths from current mirror 102 of FIG. 1 are not provided. The input stage, e.g., 106, may be comprised of differential pair transistors 302 and 308 in common source arrangement, where the differential input data signal D and D-complement is received at the control terminals, e.g., gate terminals of the differential pair. The input stage enabling signal, e.g., CLK, is received at the control terminal, e.g., gate terminal of transistor 304, whose drain terminal is coupled to the common source node of differential pair transistors 302 and 308. The terminating current source for the input stage is implemented, for example, using transistor 306, whose drain terminal is coupled to the source terminal of transistor 304 and whose source terminal is coupled to power supply reference $V_{SS}$. The control terminal, e.g., gate terminal, of transistor 306 is coupled to reference voltage, $V_{REF}$.

The output signals from the input stage are DC coupled to the output stage, e.g., 110, using for example differential transistor pair 314 and 316, by the drain terminals of differential transistor pair 302 and 308. The control terminals, e.g., gate terminals, of the output stage are coupled to receive the output signals from the input stage at nodes 340 and 342. The passive load, e.g., resistors 310 and 312, are series connected between the gate terminals of the output stage. The output stage enabling signal, e.g., CLK-complement, is received at the control terminal, e.g., gate terminal, of transistor 318, whose drain terminal is coupled to the common source nodes of output stage differential pair transistors 314 and 316. The terminating current source, e.g., 112, for the output stage is shared with the input stage and is implemented, for example, using transistor 306, whose drain terminal is coupled to the source terminal of transistor 318.

The current mirror, e.g., 102, is implemented for example by using transistors 334, 332, and 326. Voltage regulator, e.g., 104, is implemented for example by using transistor 320 and resistor 324. Transistor 332 is diode connected, whereby its gate and drain terminals are commonly coupled to the drain terminal of transistor 334 and the gate terminal of transistor 326. The gate terminal of transistor 334 is coupled to reference voltage, $V_{REF}$, and the source terminal of transistor 334 is coupled to power supply reference $V_{SS}$. The source terminals of transistors 326 and 332 are each coupled to power supply $V_{DD}$. The drain terminal of transistor 326 is coupled to the common conductors of the series connected passive loads, e.g., 108 and 116, implemented for example by resistors 310 and 312, respectively, at node 322 and to a first conductor of resistor 324. A second conductor of resistor 324 is coupled to diode connected transistor 320 at its common drain and gate terminal connection at node 338. The source terminal of transistor 320 is coupled to power supply reference $V_{SS}$.

Operational amplifier 344 and transistor 346 may be combined to implement, for example, common mode stabilizer 118. Operational amplifier 344 receives common mode voltage, $V_{CM}$, at its inverting input. The non-inverting input is coupled to node 322 and the drain terminal of transistor 346. The output of operational amplifier 344 is coupled to the gate terminal of transistor 346. It should be noted that an OTA may be used in place of operational amplifier 344, since the low output impedance of operational amplifier 344 is not necessarily required. However, in the event that an OTA is used, its relatively high output impedance may be used in combination with the gate capacitance of transistor 346 to provide additional low pass filtering of power supply noise.

In operation, input signals D and D-complement control the conductive state of the input stage, e.g., 106. Since the input stage is implemented with NFET transistors 302 and 308, a gate to source voltage, $V_{GS}$, that exceeds the threshold voltage of transistors 302 and 308 will render them conductive. The input signal is a differential signal having complementary logic states, such that when transistor 302 is conductive, for example, transistor 308 is non-conductive. Similarly, when transistor 308 is conductive, transistor 302 is non-conductive.

Once the input data signals are stable, the input stage enabling signal, e.g., CLK, transitions to a logic high voltage level, which is adequate to render transistor 304 conductive to place latch circuit 300 into a first phase of operation. The first phase of operation of latch circuit 300 places either of transistor 302 or 308 into a conductive state. If transistor 302 is conductive, i.e., data signal D is at a logic high voltage level, then a logic low voltage level is established at node 340 and a corresponding logic high voltage level is established at node 342. If, on the other hand, transistor 308 is conductive, i.e., data signal D-complement is at a logic high voltage level, then a logic low voltage level is established at node 342 and a corresponding logic high voltage level is established at node 340.

In the first phase of operation, current mirror 102, e.g. transistors 334, 332, and 326, establishes a regulated current, $I_{REG}$, flowing into node 322. The current mirror also establishes the voltage regulator current, $I_{VREG}$, flowing into node 338. The sum of currents, $I_{SUM}=I_{REG}+I_{VREG}$, is proportional to current $I_1$ flowing into node 336, according to the geometric ratio of transistor 332 and transistor 326. For example, if transistor 326 is 10 times the size of transistor 332, then $I_{SUM}$ will be 10 times the magnitude of $I_1$, since the $V_{GS}$ of transistors 326 and 332 is equivalent. Current $I_{VREG}$ flowing through diode connected transistor 320 establishes a regulated voltage at node 322, $V_{322}=V_{338}+I_{VREG}*R_{324}$ where $V_{322}$ is the regulated voltage at node 322, $V_{338}$ is the diode voltage at node 338 established by transistor 320, and $R_{324}$ is the resistance value of resistor 324.

If transistor 302 of the input stage is conductive, in other words D is at a logic high level and D-complement is at a logic low level, then a first current conduction path is generated, whereby current $I_{REG}$ is conducted from node 322, through resistor 310, transistor 302, 304, and 306. The data is transferred from the input stage to the output stage at nodes 340 and 342, whereby the voltage level at node 340, i.e., terminal Q-complement, is substantially $V_{340}=V_{322}-I_{REG}*R_{310}$, where $R_{310}$ is the resistance value of resistor 310. The voltage level at node 342, i.e., terminal Q, is substantially $V_{342}=V_{322}$. $V_{340}$ and $V_{322}$ are each established using regulated current and thus exhibit substantial independence from power supply variations.

If, on the other hand, transistor 308 of the input stage is conductive, in other words D is at a logic low level and D-complement is at a logic high level, then a second current conduction path is generated, whereby current $I_{REG}$ is conducted from node 322, through resistor 312, transistor 308, 304, and 306. The data is transferred from the input stage to the output stage at nodes 340 and 342, whereby the voltage level at node 340, i.e., terminal Q-complement, is substantially $V_{340}=V_{322}$ and the voltage level at node 342, i.e., terminal Q, is substantially $V_{342}=V_{322}-I_{REG}*R_{312}$, where $R_{312}$ is the resistance value of resistor 312. $V_{340}$ and $V_{322}$ are each established using regulated current and thus exhibit substantial independence from power supply variations.

The output stage enabling signal, e.g., CLK-complement, transitions to a logic high voltage level as the input stage enabling signal transitions to a logic low voltage level. The output stage enabling signal is adequate to render transistor 318 conductive to place latch circuit 300 into a second phase of operation. The second phase of operation of latch circuit 300 places either of transistor 314 or 316 into a conductive state. If transistor 314 is conductive, i.e., the transferred data signal at node 340 is at a logic high voltage level, then a logic low voltage level is latched at terminal Q and a corresponding logic high voltage level is latched at terminal Q-complement. If, on the other hand, transistor 316 is conductive, i.e., the transferred data signal at node 342 is at a logic high voltage level, then a logic low voltage level is established at terminal Q-complement and a corresponding logic high voltage level is established at terminal Q.

If transistor 314 of the output stage is conductive, then a first current conduction path is generated, whereby current $I_{REG}$ is conducted from node 322, through resistor 312, transistor 314, 318, and 306. The voltage level at node 340, i.e., terminal Q-complement, is substantially $V_{340}=V_{322}$. The voltage level at node 342, i.e., terminal Q, is substantially $V_{342}=V_{322}-I_{REG}*R_{312}$, where $R_{312}$ is the resistance value of resistor 312. $V_{340}$ and $V_{322}$ are each established using regulated current and thus exhibit substantial independence from power supply variations.

If, on the other hand, transistor 316 of the output stage is conductive, then a second current conduction path is generated, whereby current $I_{REG}$ is conducted from node 322, through resistor 310, transistor 316, 318, and 306. The voltage level at node 342, i.e., terminal Q, is substantially $V_{342}=V_{322}$ and the voltage level at node 340, i.e., terminal Q-complement, is substantially $V_{340}=V_{322}-I_{REG}*R_{310}$, where $R_{310}$ is the resistance value of resistor 310. $V_{340}$ and $V_{322}$ are each established using regulated current and thus exhibit substantial independence from power supply variations.

The common mode component of $V_{322}$, $V_{CM322}$, is monitored by operational amplifier 344 and compared with the voltage level of $V_{CM}$ to form an error signal at the gate of transistor 346. The error signal affects the conductivity of current source 346, such that any common mode voltage variation at node 322 is substantially cancelled by current output variation from current source 346.

For example, if $V_{CM322}$ drops, the decrease is detected by operational amplifier 344 and the difference between $V_{CM322}$ and $V_{CM}$, i.e., the error signal, is reflected at the gate terminal of transistor 346 as the amplified error signal. The amplified error signal causes a decrease in gate voltage at transistor 346, which causes transistor 346 to conduct more current. The additional current is additive to current $I_{REG}$, which develops a voltage increase across resistor 310 or 312 to substantially cancel the common mode voltage decrease at node 322.

Conversely, if $V_{CM322}$ increases, the increase is detected by operational amplifier 344 and the difference between $V_{CM322}$ and $V_{CM}$, i.e., the error signal, is reflected to the gate terminal of transistor 346 as the amplified error signal. The amplified error signal causes an increase in gate voltage at transistor 346, which causes transistor 346 to conduct less current. The depleted current causes a voltage decrease to appear across resistor 310 or 312 to substantially cancel the common mode voltage increase at node 322.

It should be noted that although resistive elements 310 and 312 are illustrated as resistors, one of ordinary skill in the art recognizes that resistive elements may also be implemented with active components. For example, resistive elements 310 and 312 may be implemented with FET devices operating in their respective ohmic or triode region. In the ohmic or triode region, the FET device behaves as a voltage controlled resistive element, whereby the drain to source voltage increases with increasing drain current. As such, the appropriate V-I characteristic may be set by the FET's control voltage to implement the required resistance value.

It should be noted that one advantage of the present invention reduces power supply ripple by locally regulating the voltage at node 322. The locally regulated voltage reduces ripple by establishing a relatively low, small signal impedance at node 322. The impedance at node 322 is a parallel combination of the relatively low impedance of the series combination of resistor 324 and transistor 320, i.e., $R_{324}+1/g_{m320}$, to the relatively high output impedance of transistor 326, where $g_{m320}$ is the transconductance of transistor 320.

The locally regulated voltage reference of the present invention provides advantages over designs using global, on-chip generated voltage references because the local voltage reference is not susceptible to noise coupling from adjacent circuit blocks. Another advantage gained by the present invention is the reduction in output noise level. Since passive loads, e.g., resistors 310 and 312, are used, the added noise that would have been produced using active loads is removed.

An additional advantage gained by the present invention is the common mode stabilization circuit that first detects common mode signal variation and then cancels the variation by applying an amplified error signal to substantially cancel the common mode signal variation. In such an instance, not only are common mode variations cancelled, but the common mode level may also be set to a known level, e.g., $V_{CM}$, during operation.

The present invention is believed to be applicable to a variety of both analog and digital circuit topologies. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit, comprising:
   a power-regulating circuit adapted to respond to a power supply voltage by providing an operating current and an operating voltage to a common node, the power-regulating circuit including,
      a current mirror adapted to provide the operating current to the common node; and
      a load coupled between the common node and a reference supply and adapted to conduct a first portion of the operating current and, therefrom, establish the operating voltage at the common node, the load including,
         a resistive element having a first conductor coupled to the common node; and
         a voltage source coupled between a second conductor of the resistive element and the reference supply;
      an input stage coupled to the common node and adapted to conduct a second portion of the operating current;
      an output stage coupled to the common node and adapted to conduct a third portion of the operating current; and
      a stabilizer coupled to the common node and adapted to provide a compensation current to the common node to stabilize the operating voltage at the common node in response to differences between a first reference voltage and a feedback voltage indicative of variations at the common node.

2. A circuit adapted to generate constant operational signals from a power supply voltage, comprising:
   a current mirror adapted to generate an operating current from the power supply voltage and coupled to supply the operating current to a common node;
   a voltage regulator adapted to generate an operating voltage from a first portion of the operating current and coupled to supply the operating voltage to the common node;
   an output stage adapted to conduct a second portion of the operating current to generate an output signal referenced to the operating voltage;
   an input stage adapted to conduct a third portion of the operating current in response to an input signal received by the circuit; and
   a common mode stabilizer adapted to compare the operating voltage to a first reference voltage and further adapted to compensate the operating current to cancel variations in the operating voltage at the common node.

3. The circuit according to claim 2, wherein the current mirror comprises:
   a first current source coupled to receive a second reference voltage and adapted to provide a bias current in response to the second reference voltage;

a first voltage source coupled to receive the bias current and adapted to provide a bias voltage in response to the bias current; and a second current source coupled to receive the bias voltage and adapted to supply the operating current in ratio proportion to the bias current.

4. The circuit according to claim 2, wherein the voltage regulator comprises:

a resistive element having a first conductor coupled to receive the first portion of the operating current at the common node and having a second conductor coupled to provide the first portion of the operating current; and a second voltage source coupled to receive the first portion of the operating current and adapted to supply the operating voltage.

5. The circuit according to claim 4, wherein the second voltage source includes a current conduction device having a control terminal and a conduction terminal coupled together at the second conductor of the resistive element.

6. The circuit according to claim 5, wherein the current conduction device includes a Field Effect Transistor (FET).

7. The circuit according to claim 2, wherein the common mode stabilizer comprises:

an error signal generator having a first input coupled to the common node, a second input coupled to receive the first reference voltage, and an output adapted to provide an error signal indicative of a difference between the operating voltage and the first reference voltage; and a current conduction device having a control terminal coupled to receive the error signal and coupled to provide the compensating current to the common node in response to the error signal.

8. The circuit according to claim 7, wherein the error signal generator includes an operational amplifier.

9. The circuit according to claim 7, wherein the error signal generator includes an operational transconductance amplifier.

10. The circuit according to claim 7, wherein the current conduction device includes a Field Effect Transistor (FET).

11. A locally regulated circuit, comprising:

means for generating a constant current signal from a power supply signal;

means for generating a voltage signal from a first portion of the constant current signal;

means for conducting a second portion of the constant current signal to generate an output signal referenced to the voltage signal;

means for conducting a third portion of the constant current signal in response to a received input signal;

means for comparing the voltage signal to a reference signal to generate an error signal; and means for compensating the constant current signal in response to the error signal to regulate the voltage signal.

12. A method of operating a locally regulated circuit, the method comprising:

generating a constant current signal from a power supply signal;

generating a voltage signal from a first portion of the constant current signal;

conducting a second portion of the constant current signal to generate an output signal referenced to the voltage signal;

conducting a third portion of the constant current signal in response to receiving an input signal;

comparing the voltage signal to a reference signal to generate an error signal; and compensating the constant current signal in response to the error signal to regulate the voltage signal.

13. The method according to claim 12, wherein generating the constant current signal comprises:

generating a bias current in response to a reference voltage; and generating a bias voltage in response to the bias current, wherein the bias voltage induces a magnitude of the constant current signal to be in ratio proportion to the bias current.

14. The method according to claim 13, wherein generating the voltage signal comprises:

generating a first reference voltage from the first portion of the constant current signal; and summing the first reference voltage with a second reference voltage generated by conducting the first portion of the constant current signal through a resistive element.

15. The method according to claim 12, wherein comparing the voltage signal to a reference signal includes generating a difference between the voltage signal and the reference signal.

16. The method according to claim 15, wherein compensating the constant current signal comprises:

increasing a magnitude of a variable current signal in response to a decreasing magnitude of the error signal; and decreasing the magnitude of the variable current signal in response to an increasing magnitude of the error signal.

17. The method according to claim 16, wherein compensating the constant current signal further comprises summing the constant current signal with the variable current signal to offset variations in the voltage signal.

* * * * *